United States Patent [19]
Sanders et al.

[11] Patent Number: 5,887,827
[45] Date of Patent: Mar. 30, 1999

[54] METHOD FOR PRODUCING EXTREME MICROGRAVITY IN EXTENDED VOLUMES

[76] Inventors: Alvin Joyner Sanders, 735 Chateaugay Rd., Knoxville, Tenn. 37923; William Edward Deeds, 3601 Montlake Dr., Knoxville, Tenn. 37920; Mark Edward Rupright, 3611 Lakeview, Union City, Tenn. 38261

[21] Appl. No.: 285,219

[22] Filed: Aug. 3, 1994

Related U.S. Application Data

[62] Division of Ser. No. 912,903, Jul. 13, 1992, abandoned.

[51] Int. Cl.⁶ .................................................. B64G 1/24
[52] U.S. Cl. ............................................... 244/168
[58] Field of Search ................................ 244/158 R, 168, 244/169

[56] References Cited

U.S. PATENT DOCUMENTS

| | | | |
|---|---|---|---|
| 3,116,035 | 12/1963 | Cutler | 244/168 |
| 3,145,948 | 8/1964 | Kershner | 244/1 |
| 3,179,502 | 4/1965 | Rummel | 23/301 |
| 3,239,165 | 3/1966 | Sohn | 244/168 |
| 3,258,598 | 6/1966 | Schalkowsky | 244/168 |
| 3,358,944 | 12/1967 | Ule | 244/1 |
| 3,534,926 | 10/1970 | Wuenzcher | 244/1 |
| 4,262,867 | 4/1981 | Piening | 244/168 |
| 4,408,740 | 10/1983 | Kleber | 244/158 R |
| 4,704,258 | 11/1987 | Hemmerdinger et al. | 422/254 |
| 4,758,267 | 7/1988 | Webb | 75/0.5 R |
| 4,896,849 | 1/1990 | Moynihan | 244/158 R |
| 4,960,572 | 10/1990 | Littka | 422/245 |
| 5,009,861 | 4/1991 | Link | 422/245 |
| 5,013,531 | 5/1991 | Synder et al. | 422/245 |
| 5,020,743 | 6/1991 | von Bun et al. | 244/158 R |
| 5,058,833 | 10/1991 | Carmouche | 244/158 R |
| 5,183,225 | 2/1993 | Forward | 244/168 |

OTHER PUBLICATIONS

Carlos M. Grodsinsky, "Development and Approach to Low–Frequency Microgravity Isolation Systems", NASA Technical Paper 2984—Aug., 1990.
B. Lang, *Amer. Inst. Aeronau. Astronaut. J.*, 2:1590 (1964).
Staff of Space Dept., John Hopkins U., Applied Physics Lab., and Staff of Guidance and Control Lab., Stanford U., *J. Spacecraft Rockets*, 26:735 (1982).
R. L. Forward, *Phys. Rev. D,*, 26:735 (1982).
R. Friedberg, *Phys. Rev. D.*, 36:386 (1986).
J. G. Hills, *Astron. J*, 92:986 (1986).
D. R. Long, *Nature(London)*, 260:417 (1976.
J. L. Wright, "Space Sailing" Gordon and Brech Scientific Publications (1992).
Owens, et al., N90–24462, *ESA, Fourth European Space Mechanisms and Tribology Symposium*, (Mar., 1990).
J.I.D. Alexander, *Micrograv. Sci. Technol. III*, 52:2 (1990).

*Primary Examiner*—Galen L. Barefoot
*Attorney, Agent, or Firm*—Luedeka, Neely & Graham, P.C.

[57] ABSTRACT

An apparatus and method for use thereof in the creating of a nanogravity environment substantially throughout a working volume sufficient for performing a desired operation and existing for a length of time sufficient for performing the desired operation are disclosed. Involved in the creation of the nanogravity environment are the use of an apparatus in which the mass density of the walls are distributed (either directly or by the attachment of compensating masses) so that the surface density of the mass is directly proportional to the electric charge density along the walls which would be sufficient to neutralize the interior electric field, the orbiting of the apparatus around a planetary mass, and the minimization of disruptive accelerations on the apparatus by the selective transfer of the momentum of solar photons to the apparatus.

6 Claims, 4 Drawing Sheets

METHOD FOR PRODUCING EXTREME MICROGRAVITY IN EXTENDED VOLUMES

This is a division of application Ser. No. 07/912,903, filed Jul. 13, 1992 now abandoned.

This invention relates generally to the control of the internal environment of orbital space-based platforms and specifically to the creation and maintenance of a nanogravity environment on an orbital space-based platform covering an appreciable working volume and existing for an extended period of time.

The creation and maintenance of an environment containing extremely low internal gravity has long been desired. Such an environment offers the opportunity to conduct operations involving physical processes which are altered in the presence of an appreciable gravitational field. Many physical processes are sensitive to time-dependent accelerations. Such physical processes include: 1) mass transfer, 2) heat transfer, 3) convection, 4) oscillation, 5) and the distortion of free surfaces. Isolation of such physical processes from gravitational forces allows for operations which were previously impossible due to gravitational influences, such as 1) measuring the gravitational interaction between two bodies caused by the mutual gravitational forces which they exert on each other, 2) growing both organic and inorganic crystals, 3) materials processing, and 4) experimenting with fluid density gradients which are inherently sensitive to the effects of buoyancy-driven fluid motion. Such processes, moreover, while being altered in the presence of an appreciable gravitational field, are also effected adversely by other accelerations produced during the regulation and maintenance of the orbit of space-based platforms, such as satellites, spacecraft, and other artificial constructs, in which they are traveling (e.g., thrusting designed to compensate for atmospheric drag). By Einstein's Equivalence Principle, any such accelerations are fully equivalent to gravitational accelerations of the same size.

The above applications are either dependent on or substantially enhanced by the provision of a microgravity environment. Such an environment is defined as having a gravitational field strength of between about 1 micro g and about 100 micro g ($10^{-6}$ to $10^{-4}$ g's), where g is the acceleration due to gravity at the earth's surface, approximately 9.8 m $s^{-2}$.

There have been several efforts relating to the production of a sub-microgravity environment (i.e., $<10^{-6}$ g). One such effort is the drag-free satellite. This rationale for creating near zero internal gravity at a point in the center of a satellite was proposed in the 1960's by Lange and by APL and Stanford, and two TRIAD Transit satellites utilizing such a method were launched. (B. Lange, Amer. Inst. Aeronau. Astronaut. J. 2, 1590 (1964); Staff of Space Dept., Johns Hopkins U., Applied Physics Lab., and Staff of Guidance and Control Lab., Stanford U., J. Spacecraft Rockets 11, 637 (1974).) However, the sub-microgravity environment which the method produced did not extend throughout an appreciable volume of the platform.

Another related effort, flattening space-time, concerned the removal of mainly tidal effects. This method, which was never tested, involved the removal of all gravitational gradients at a point, including those caused by the earth. (R. L. Forward, Phys. Rev. D 26, 735 (1982); Richard Friedberg, ibid. 36, 386 (1986).)

It has been known since the time of Newton that the internal gravitational field strength of a perfect spherical shell is zero. From any point in the interior of the shell, the mass elements in opposite directions about the periphery exert equal and opposite gravitational influences, producing a vector sum of zero g. Researchers have suggested using this fact to construct a spherical satellite which would be used to determine the universal gravitational constant G to a new magnitude of accuracy. (J. G. Hills, Astron. J. 92, 986 (1986)). This sphere, however, is an ideal sphere, and the gravitational effects produced by the instrumentation, thrusters, and likely nonuniformities in the mass density of the walls would spoil the spherical symmetry. Although it is possible to compensate for these effects, the presumed advantage of initial spherical symmetry is negated.

It has also long been known that a very thin walled uniform hollow cylinder has very low internal gravity far from the ends of the cylinder. An infinitely long cylinder has zero internal gravity. Cylinders have been used previously as approximations to a "gravitational Faraday cage." It is well known that electrical charge will distribute itself on the surface of any closed conducting container in such a manner that the electric field strength will be exactly zero throughout the interior volume. The "Faraday cage" is a direct consequence of the inverse square law for electrostatic forces and is also applicable to gravitational fields as well as electrical fields, both being subject to inverse square relationships. Previous efforts have utilized this principle either to obtain a closed-form expression merely to calculate the internal gravitation field strength of the uniform cylinder or to enable the researcher to ignore the effects altogether. (D. R. Long, Nature (London) 260, 417 (1976).) There has been no published method to utilize the law to redistribute mass in such a way as actually to produce sub-microgravity through the interior of the cylinder.

Another problem which has limited the creation of a submicrogravity environment is the effect of "tidal forces" on the orbital space-based platform. A platform is not a point mass. While the center of mass of a "drag-free" platform follows a free-fall orbital path, experiencing zero gravity, other parts of the platform are forced to follow paths differing slightly from free-fall, thus experiencing small forces, known as tidal forces. These tidal forces cannot practicably be made arbitrarily small, for they have a practicable floor determined by orbital mechanics and by the spatial aspects of the operational payload. The magnitude of the force exerted on a particular element of the platform depends primarily upon the gradient of the earth's gravity, the difference in altitude between the particular element and the center of mass of the platform, and the rotational state of the satellite.

Previous efforts to minimize tidal forces include those of R. L. Forward of Hughes Research Lab. (R. L. Forward, Phys. Rev. D 26, 735 (1982)). This method involved the use of a geostationary orbit (altitude 36,000 km) and of surrounding the experimental mass with a horizontal ring of spherical masses. The calculations predicted a theoretical reduction of gravity to less than one thousandth of a nano g. This approach, however, failed to consider the effects of some disrupting accelerations, particularly low frequency vibrations produced by the materials-handling operations in the method. This work, moreover, fails to consider that the tidal forces may be reduced by ⅔ simply by counter-rotating the experimental chamber (as noted in the detailed description) and that a cylinder with a properly distributed mass is equivalent to a spherical shell in terms of having about zero internal gravity.

Most of the recent efforts dealing with utilization of the U.S. Space Shuttle and other existing platforms have focused on locating the payloads near the center of mass of the platform, thus minimizing the effects of platform attitude changes. These approaches fail to create a sub-microgravity environment. Published studies on the next generation of low-gravity experimentation do not contemplate further steps to reduce tidal forces.

There is also an apparatus for acceleration-free mounting of a body in a spacecraft (U.S. Pat. No. 4,408,740). The apparatus comprises an evacuable protection box with internal contactless scanning units which monitor the position of a body inside the box. The box is connected along all three major axes by a guiding system firmly connected to the spacecraft. With the use of driving means, the box tracks with the body it contains, changing its position relative to the spacecraft as the body changes its position. This apparatus does not produce a sub-microgravity environment for an extended period; rather it allows for a micro g environment for only a fraction of the orbital period.

A further impediment to the creation of a sub-microgravity environment is the effect of disruptive accelerations on the orbital space-based platform, produced by atmospheric drag, solar radiation, and low frequency vibrations, "g-jitters". These accelerations are disruptive in that any acceleration is, by Einstein's Equivalence Principle, fully equivalent to an acceleration of the same magnitude and direction due to gravitational force, in that the physical effects at any instant due to any acceleration are identical to and indistinguishable from the effect which would result from whatever mass distribution would be required at that instant to produce the same acceleration by gravitational force. Such accelerations, particularly atmospheric drag, have historically been compensated for by small thrusters. Such devices are inadequate, however, in that they are expensive, prone to malfunctioning, require bulky equipment, have limited lifetimes, and produce "jerks" rather than smooth uniform thrust.

Solar radiation is typically regarded as an additional problem in that it may operate to reduce orbital energy by applying retarding forces to the orbital space-based platform. Available methods exist to make platforms drag free. Methods also exist for harnessing solar radiation to augment orbital mechanical energy and angular momentum, typically using large solar sails for large orbital changes including interplanetary transfers. (U.S. Pat. No. 3,588,00; J. L Wright, Space Sailing, Gordon and Brech Scientific Publications (1992)).

Methods for isolating low frequency vibrations, g-jitters, are under development. Research has centered around the use of passive and active isolation mounts on existing systems such as the U.S. Space Shuttle, rather than designing orbital space-based platforms which themselves provide a smooth and continuously stable orbit, being inherently as vibration free as possible. (Grodsinsky, Development and Approach to Low-Frequency Microgravity Isolation Systems, N90-28754,; Owens et al., N90-24462, In ESA, Fourth European Space Mechanisms and Tribiology Symposium (March 1990)).

Thus, despite more than three decades of space research, there are no extant or proposed devices capable of reducing the internal gravitational fields of orbital platforms into the nano g ($10^{-9}$ g) range for extended periods of time. A need exists to reach this range for both theoretical and industrial purposes. (J. I. D. Alexander, 52 Micrograv. Sci. Technol. III (1990)2).

It is therefore an object of the present invention to create a very high quality low level gravitational environment in the range of about 1 nano g to about 100 nano g (about $10^{-9}$ g to $10^{-7}$ g) which occurs substantially throughout a working volume sufficient for performing a desired operation and existing for a length of time sufficient for performing the desired operation.

It is a further object of the present invention to create a nanogravity environment in an orbital space-based platform by distributing the mass density of the walls (including compensator mass means) of the orbital space-based platform so that the surface density of the mass is directly proportional to the electric charge density along the walls which would be sufficient to neutralize the interior electric field of the orbital space-based platform.

It is a further object of the present invention to create a nanogravity environment by attaching about the exterior of the orbital space-based platform compensator mass means having masses and radii chosen to minimize the internal gravitational field of the space-based platform.

It is a further object of the present invention to harness solar radiation to stabilize substantially and nonabruptly the orbital mechanical energy and angular momentum of a space-based platform and to avoid the effects of disruptive accelerations on the platform which are produced by such factors as tidal forces, atmospheric drag, and low frequency vibrations which may be caused by equipment or crew motion or by the possible efforts (such as using thruster rockets) to counteract the producers of disruptive acceleration.

It is a further object of the present invention to stabilize substantially and nonabruptly the orbital mechanical energy and angular momentum of the orbital space-based platform against the effects of disrupting accelerations by the transfer of momentum from solar photons to the orbital space-based platform.

It is a further object of the present invention to variably alter nonabruptly the orbital mechanical energy and angular momentum of the orbital space-based platform by the transfer of momentum from solar photons to the orbital space-based platform.

SUMMARY OF THE INVENTION

The principle features of our method include: 1) utilizing the inherently very low gravitational characteristics of a substantially uniform at least partially hollow cylinder, 2) distributing the mass of the space-based orbital platform in a manner that will lower the strength of the platform's internal gravitational field to about zero throughout the working volume for a desired period of time, 3) placing the space-based orbital platform in orbit around a planetary mass, 4) minimizing the "tidal forces" exerted upon the platform by planetary masses, such as a planet, star, asteroid, natural or artificial satellite, or any natural or artificial space body, external to the platform by optimum orbital orientations of the platform and its experimental chambers, and 5) substantially preventing disrupting accelerations produced by such factors as solar radiation pressure, atmospheric drag, and low frequency vibrations, g-jitters.

Our method proposes to reduce tidal effects by: 1) using a large aspect ratio (length/width) for the platform, 2) orbiting the platform with its longitudinal axis horizontal so that the altitudes of all experimental chambers are nearly equal, and 3) rotating the experimental chambers within the platform so that the experimental chambers have nearly constant orientation in inertial space.

Our method involves the passive use of solar radiation to stabilize substantially and nonabruptly the orbital mechanical energy and angular momentum of the platform. This stabilization is accomplished by utilizing the design and orientation of the body of the platform, solar cell panels, or very small solar sails. Our method is to be contrasted with conventional approaches to solar sailing in that our method does not appreciably increase the total area available for photon momentum transfer.

Our method for reducing g-jitters includes the use of solar sailing as described above to control orbital energy and angular momentum and the use of torque rods or coils (rather than reaction wheels or jets) to control attitude.

BRIEF DESCRIPTION OF THE DRAWINGS

Reference to the following detailed description of an exemplary embodiment may help to better explain the invention. Consider the description in conjunction with the drawings in which:

FIG. 2 shows drawings of embodiments of the present invention wherein

FIG. 3 shows a diagram of the forces on a space platform due to solar photons with its velocity vector being oriented at an appreciable angle to the earth-sun line, wherein

DETAILED DESCRIPTION OF THE INVENTION

This method of producing a nanogravity environment is an improvement over previous reduced gravity systems extant and proposed. Previous efforts have utilized the relatively low gravity environment which inherently exists in any orbiting platform but have largely ignored the gravitational influences produced by the platform itself. The orbital space-based platform itself exerts a low but not negligible gravitational force on the masses in close proximity to it. The effect is generally below the micro g level for platforms with less than about 1 ton in total mass. This low level, although a significant impediment to producing a nanogravity environment, is negligible when compared to the disrupting accelerations produced by such factors as atmospheric drag and low frequency vibrations, g-jitters. Since these disrupting accelerations may largely be obviated by our method, the gravitational force exerted by the platform itself is no longer irrelevant by comparison and must be nullified if a nanogravity environment is to be produced.

The first part of our method for producing about zero g in a working environment for a desired period of time involves distributing the mass of the space-based orbital platform in a manner that will lower the strength of the platform's internal gravitational field to about zero throughout the working volume. That is, the mass of the space-based orbital platform may be distributed to create a "gravitational Faraday cage" either by varying the mass density of the walls of a substantially cylindrical container directly or by the attachment of compensator mass means to the exterior of a uniform hollow cylinder, or by a combination of both.

Figure 1:
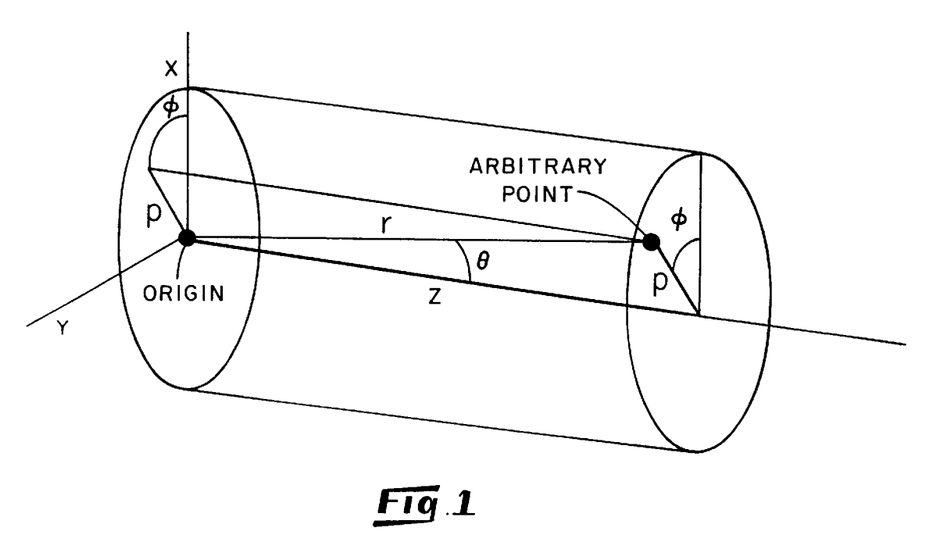
FIG. 1 shows the coordinate system which is used to describe mathematically the present invention.
Figure 2A:
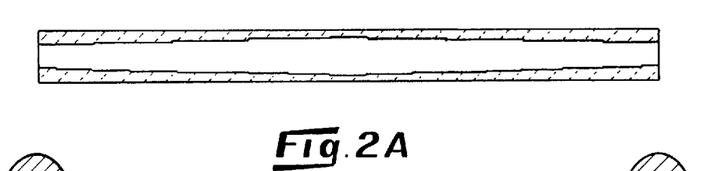
FIG. 2A shows a space platform having cylindrical wall of variable thickness.
Figure 2B:
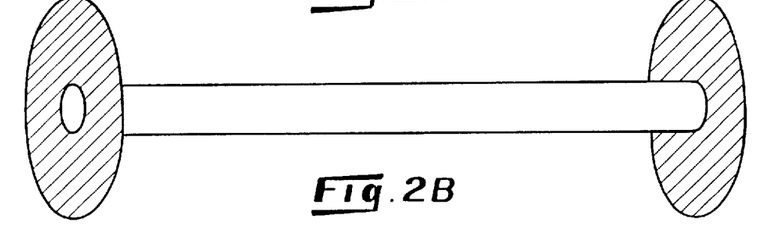
FIG. 2B shows a space platform having solid disks at the ends of the cylinder.
Figure 2C:
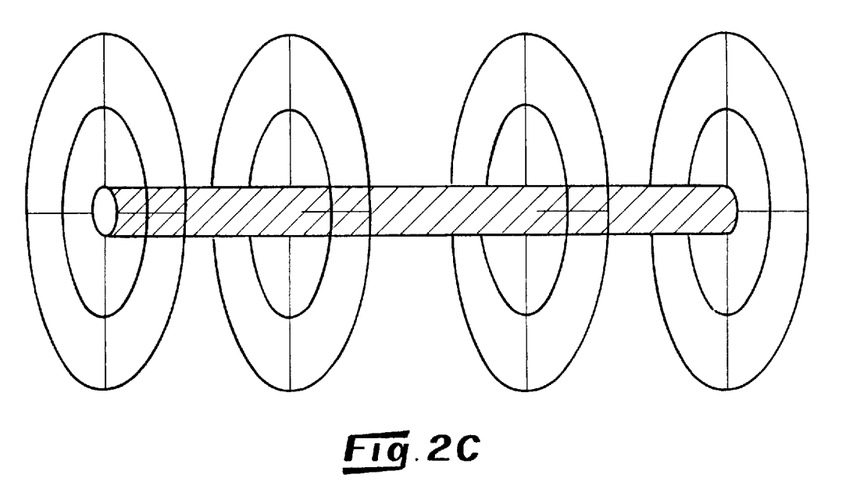
FIG. 2C shows a space platform having rings about the cylinder.

Regarding the continuous distribution of the mass density of the walls to create a nanogravity environment, as shown in FIG. 2A, for a right circular cylinder of length L and radius b, as seen in FIG. 1, the linear mass density $\lambda(z)$ in the sidewalls and the areal density $\sigma(\rho)$ on the end cap may be expanded in two Taylor series:

$$\lambda(z) = \frac{M_0}{L} + \sum_{n=0}^{\infty} a_n z^n \text{ and } \sigma(\rho) = \frac{M_0}{(\pi b^2)} + \sum_{n=0}^{\infty} c_n \rho^n \quad (1)$$

for n even. This expression assumes infinitesimally thin walls. If we eliminate $a_n$ and $c_n$ by defining the new parameters $M_n$ and $m_n$ as $$M_n = a_n \left(\frac{2}{n+1}\right)\left(\frac{L}{2}\right)^{n+1} \text{ and } m_n = c_n \left(\frac{2\pi}{n+2}\right) b^{n+2} \quad (2)$$

then the total mass of the side and end walls of the cylinder are simply:

$$\int_{-\frac{L}{2}}^{\frac{L}{2}} \lambda(z) dz = \sum_0^{\infty} M_n \text{ and } \int_0^b \sigma(\rho) 2\pi \rho d\rho = \sum_0^{\infty} m_n \quad (3)$$

(the series being terminated after a finite number of terms).

Under this method of computation, accuracy is improved by a pair of rings of mass $M_R$ and of fixed radius b at the ends of the cylinder, the rings being a good physical proxy for the omitted high order terms in both z and $\rho$. The use of such rings with appropriate masses to accomplish the same effect as a continuous distribution of mass is a significant innovation of our method. Nanogravity may be achieved by only a few terms in the two Taylor series if such end rings are used.

The mean-square gravitational force over any volume is exactly a quadratic function of all parameters, provided the spatial information is expressed entirely by the mass configurations and not explicitly by any parameter. For example, one such "non-spatial" parameter is the set $\{M_n, m_n, M_R\}$ used for the double Taylor series and the rings above in equations 1–3. The parameters per se do not explicitly entail spatial variables but rather are merely the multipliers of specified configurations ($z^n$, $\rho^n$, and the discrete rings). The fact that the mean-squared force is quadratic guarantees the uniqueness of those parameter values (i.e., no local minima exist) which make the gravitational field vanish throughout the volume and, a fortiori, on axis. Conversely, those parameter values which nullify the field on axis will also nullify it throughout the cylindrical volume. Thus, the mean-square force need only be minimized on the axis.

The minimization on the axis approach is possible due to the cylindrical symmetry, the uniqueness of solutions to Laplace's equation, and the fact that the Taylor series converge and are complete. Completeness is easily proven by a physical analogy taken from electrostatics, that electric charge distributes itself on a closed conducting surface so that the internal electric field is zero.

The mean-squared force is a quadratic function of "non-spatial" parameters for any superposition of mass configuration, however arbitrary, whether or not complete. If, however, any parameter explicitly describes the mass location (e.g., one parameter being the radius of an end ring), the mean-square force is not exactly a quadratic function of the parameters.

A useful strategy for solving a particular mass distribution problem involves: (a) carrying out a minimization of the field on axis by first varying some external configuration of masses (perhaps subject to various constraints), (b) fixing the parameters thus determined, and finally (c) varying the mass distribution on the cylinder walls.

The effect of the smoothly-varying density such as described above can be satisfactorily approximated by affixing long slats of graded width to the cylinder walls, the number of slats being chosen sufficient to preserve approximately the symmetry of the substantially cylindrical container.

The internal gravitational force of an infinitely long uniform circular cylinder would be zero throughout the interior, by Gauss's law. For a cylinder of finite length, there are substantial end effects, which peak at the ends per se. On the axis of a cylinder of length L and radius a, at a distance z from the middle, the gravitational field is purely axial, and the strength is described by the following equation:

$$F_z = \frac{GM}{L}\left(\left[\left(\frac{L}{2}+z\right)^2 + a^2\right]^{-\frac{1}{2}} - \left[\left(\frac{L}{2}-z\right)^2 + a^2\right]^{-\frac{1}{2}}\right) \quad (4)$$

This expression assumes infinitesimally thin walls. The gravitational field strength peaks at the ends per se. Two or three pairs of rings of suitable mass and radius, located symmetrically near the ends of the cylinder, are sufficient to substantially cancel the end-effects of the long cylinder of finite length.

The axial force at a position on the axis of a cylindrical ring of mass M and radius p at a distance z from its center is $$F_z(z,\rho,\phi) = GMh(z,\rho) \quad (5)$$

where the function $$h(z,\rho) = z(z^2 + \rho^2)^{-1.5} = \frac{z}{r^3} = \frac{\cos\theta}{r^2} \quad (6)$$

where $$r^2 = z^2 + \rho^2 \quad (7)$$

Equation 4 may be generalized as $$F_z = G\int_m h(z,\rho)dm = GM\langle h\rangle \quad (8)$$

where the averaging brackets denote the average with respect to mass. This form is completely general; it does not rely on the particular shape or orientation of a ring or other distribution. This general form is suitable for treating non-ideal cases, including off-axis rings, rings of finite thickness, and tilted or distorted rings. A Taylor expansion of the integrand to second order is sufficient to give the approximate departures of the actual field from the force on axis due to the ideal ring:

$$F_z = G\int_M \left[ h(z_0,\rho_0) + (z-z_0)\frac{\partial h}{\partial z} + (\rho-\rho_0)\frac{\partial h}{\partial \rho} + \right. \quad (9)$$
$$\left. \frac{1}{2}(z-z_0)^2\frac{\partial^2 h}{\partial z^2} + \frac{1}{2}(\rho-\rho_0)^2\frac{\partial^2 h}{\partial \rho^2} + (z-z_0)(\rho-\rho_0)\frac{\partial^2 h}{\partial z\partial\rho} \right] dm$$

$$= GM\left[ h(z_0,\rho_0) + \langle z-z_0\rangle\frac{\partial h}{\partial z} + \langle \rho-\rho_0\rangle\frac{\partial h}{\partial \rho} + \right. \quad (10)$$
$$\left. \frac{1}{2}\langle(z-z_0)^2\rangle\frac{\partial^2 h}{\partial z^2} + \frac{1}{2}\langle(\rho-\rho_0)^2\rangle\frac{\partial^2 h}{\partial \rho^2} + \langle(z-z_0)(\rho-\rho_0)\rangle\frac{\partial^2 h}{\partial z\partial\rho} \right]$$

The derivatives are all evaluated at $(z_0,\rho_0)$ and are constants with respect to the integration:

$$\frac{\partial h}{\partial z} = h_z = (\rho^2 - 2z^2)r^{-5}\big|_{z_0,\rho_0} \quad (11)$$

$$\frac{\partial h}{\partial \rho} = h_\rho = -3z\rho r^{-5}\big|_{z_0,\rho_0} \quad (12)$$

$$\frac{\partial^2 h}{\partial z^2} = h_{zz} = 3z(2z^2 - 3\rho^2)r^{-7}\big|_{z_0,\rho_0} \quad (13)$$

$$\frac{\partial^2 h}{\partial \rho^2} = h_{\rho\rho} = 3z(4\rho^2 - z^2)r^{-7}\big|_{z_0,\rho_0} \quad (14)$$

$$\frac{\partial^2 h}{\partial z\partial\rho} = h_{z\rho} = 3\rho(4z^2 - \rho^2)r^{-7}\big|_{z_0,\rho_0} \quad (15)$$

The optimal radii and mass of the rings may be estimated by forming the function which is the mean-squared force throughout a portion of the cylinder volume, then minimizing the function with respect to the masses and radii of the rings. The function is minimized by expansion as a Taylor series to second order with respect to the parameters (not the spatial coordinates) at some initial point in parameter space (i.e., at some set of radii and masses) and determination of the point in parameter space where the gradient of this Taylor expansion vanishes. The first and second derivatives at the initial point in parameter space, used in the Taylor expansion, may be conveniently evaluated either numerically or analytically. The requirement for a vanishing gradient produces a set of N linear equations with N unknowns, where N is the number of free parameters solvable by matrix methods. This procedure is then iterated. The neglect of higher order derivatives may be justified in the sense that convergence is rapid.

The criteria for choosing the parameters of the compensator mass means may be varied to reflect particular needs of the operation. The criteria include: 1) incorporation of off-axis points (for restrictive spatial applications), 2) the minimization function may be the minimax of the gravitational force rather than RMS or average; and, 3) the minimization function may be an average over a higher power than the square (e.g., the fourth or eighth power) of the gravitational force, the higher power being useful as an approximation of the minimax criterion by weighting large deviations more heavily than the square.

It may also be desirable to provide for changing the mass or position of compensator mass means while in orbit in order to offset the effects of changing mass distribution. Of particular interest is the consumption of fuel if thrusters are used for changes in orbit or attitude. Effects of decrease in total onboard fuel can be mitigated by strategic choice of fuel reservoir shape and location, and furthermore the compensator mass means can be moved slightly as fuel is consumed (or alternatively by use of non-fuel orbit and attitude control systems, such as solar sailing and torque rods, or by combination of mass movement means and nonfuel control systems).

Another aspect of the proposed method is the minimization of the effects of tidal forces, a form of disruptive acceleration on the orbital space-based platform by: 1) using as the orbital space based platform a structure with a large aspect ratio (length/width), a substantially cylindrical container, and 2) regulating the orbital orientations of both the orbital space-based platform and its internal experimental chambers. The orbital space based platform is not a point mass. Although the center of mass of a drag-free platform follows the path predicted by external gravitational forces acting on the platform, other parts of the platform are constrained to follow paths which differ slightly from the free-fall orbital path. These differing trajectories produce tidal forces.

These tidal forces, moreover, cannot practicably be made arbitrarily small but rather have a practical floor determined by orbital mechanics and by the spatial extent of the desired operation. The size of the effect on a particular volume element of the platform depends on the gradient of the earth's gravity, the difference $\Delta r$ in altitude between this element and the center of mass of the platform, and the rotational state of the platform.

If the orbital orientation of the platform is such that the vertical direction with respect to the earth is nearly constant (i.e., the same side of the platform is always "down"), the tidal acceleration is simply the product of the local gradient of the earth's gravity and the difference in altitude $\Delta r$:

$$a_T = \frac{dg}{dr} \Delta r \tag{16}$$

Carrying out the indicated differentiation and re-expressing the result in terms of g, the tidal acceleration is:

$$a_T = 2\left(\frac{R_E^2}{r^3}\right) g \Delta r \tag{17}$$

where $R_E$ is the radius of the earth and r the orbital radius.

The average tidal acceleration on any given element can be reduced by a factor of 3 if the platform's orientation is constant in inertial space rather than in a rotating earth-centered co-ordinance, due to the individual volume elements' moving in paths which better approximate free-fall. If a particular experimental chamber is regarded as a separate platform, the tidal acceleration on any chamber may be reduced by: 1) rotating it with respect to the main platform once per orbit counter to the platform's orbital motion, and 2) maintaining the center mass of the chamber at the same altitude as the main platform. The second condition is met automatically by a platform with a large aspect ratio (length/width), the substantially cylindrical container, with at least one chamber along its longitudinal axis, provided the long axis of the substantially cylindrical container is horizontal (i.e., oriented essentially like an arrow in flight).

In summary, our method reduces tidal effects by: a) using a large aspect ratio for the platform, b) orbiting the platform with its longitudinal axis horizonal, and c) rotating the experimental chambers with the platform so that the experimental chambers have a constant orientation in inertial space.

Another aspect of the proposed invention is the passive use of solar radiation to stabilize substantially and non-abruptly the orbital mechanical energy and angular momentum of the orbital space-based platform. The object is to use the reactive forces of the sunlight to control the orbit and attitude of the platform. The method of this aspect involves the use of the surfaces of the orbital space-based platform per se to control the reflection of solar radiation in order to: 1) maintain the orbit, 2) to make small, gradual changes in the orbit, or 3) to aid in controlling the attitude of the platform.

This aspect is further designed to compensate for disrupting accelerations, especially the effects of atmospheric drag in low earth orbit and the introduction of low frequency vibrations, g-jitters, such as would be produced by conventional thruster systems. Indeed, this aspect of the invention is useful on any platform where there is a need for adjusting or maintaining the orbit. Other uses include: 1) very-long-duration orbital maintenance (avoids consuming non-renewable thruster fuel), 2) fine control of orbital period (to maintain synchronization of the orbits of more than one platform, such as a constellation of communication or navigation satellites), 3) and ultra-fine control of orbital shape. This stabilization is accomplished by utilizing the design and orientation of the body or the platform, solar cell panels, or small solar sails. By small solar sails is meant that the solar sails do not substantially increase the surface area of the platform.

Solar radiation consists chiefly of photons, which are "particles" of light and which travel along the light rays. These solar photons produce by far the bulk of all thrusts and torques due to solar reaction. By contrast, the "solar wind," composed primarily of high-speed protons and alpha particles, is much weaker, and solar neutrino radiation may be neglected completely. Each photon carries momentum $h/\lambda$, where $\lambda$ is its wavelength and h is Planck's constant.

A light beam of power density P (energy per unit time per unit area) will, if perfectly absorbed, exert a pressure P/c (force per unit area) on the absorbing surface, where c is the velocity of light. If the light is completely reflected back on itself by a perfectly reflecting surface oriented perpendicular to the incoming photons, the total change of photon momentum per unit time will be doubled, and the pressure on the reflecting surface will be 2P/c. In practice, as the light is more likely to be neither perfectly absorbed nor perfectly reflected and as the surface will not be totally perpendicular to the incoming photons, the pressure (force per unit area) is determined by denoting the vector momentum density of the incoming photons as $P_i/c$, the absorbed density $P_a/c$, and the reflected density as $P_r/c$, and by the vector subtraction of $P_a$ and $P_r$ from $P_i$. Alternatively, the net force is the vector sum of a part in the direction of the incoming beam and a part opposite to the reflected beam. In the case of perfect reflection, the net reaction force is perpendicular to the reflecting surface and is pointing into the reflecting surface, as $P_a/c$ is zero and the absolute magnitudes $P_i/c$ and $P_r/c$ are equal.

By controlling the amount of solar thrust along the orbital track (i.e., the direction of the orbital space-based platform's velocity) it is possible to control the size of the orbit (its semi-major axis, and thus its period and orbital energy), its eccentricity, the argument (angular position) of perigee, and the epoch argument. Thrust components perpendicular to the orbital track are customarily resolved into a radial component (essentially vertical) and a "cross-track" component (essentially horizontal). Radial components of solar thrust can be used to gradually change the eccentricity of the orbit and the locations of perigee and apogee. Cross-track components can modify the plane of the orbit. It should be noted that interrelationships among orbital parameters must be taken into account (e.g., the rates of precession of the ascending node and of the perigee argument depend on the semi-major axis and the inclination of the orbit). Solar radiation may also be used to control the torque as well as the thrust on the orbital space-based platform, enabling its attitude to be influenced (i.e, the pitch, roll, and yaw of the platform are controlled).

The orbital mechanical energy of the platform of mass m is the sum of its kinetic and potential energy:

$$E = mU(r,\theta,\phi) + \tfrac{1}{2}mv^2 \qquad (18)$$

where $\{r,\theta,\phi\}$ is the platform position in conventional earth-centered spherical coordinates, v is the speed of the platform in this system, and $U(r,\theta,\phi)$ is the earth's gravitational potential. For an ideal spherical earth of mass M, the potential $U(r,\theta,\phi)$ would take the simple form $$U(r) = \frac{MG}{r}. \qquad (19)$$

Our method for producing a nanogravity environment in an orbital space-based platform seeks to utilize solar radiation to stabilize substantially and nonabruptly the orbital mechanical energy and angular momentum of the space-based platform: 1) by controlling the angle of reflection of the solar photons which reflect off the platform in such a manner that the reaction thrust will have a non-zero component in the desired direction (especially the platform's along track direction)(i.e., producing a desired asymmetry), and/or 2) by exploiting the difference between the absorption and reflection of the sunlight to modify the amount and direction of the pressure which the radiation will exert on the surface (which can vary from P/c, perfect absorption, to 2P/c, perfect reflection directed backwards).

Regarding the control of the angle of reflection of the solar photons to produce a reaction thrust with a desired asymmetry, there are in our method three variants: 1) control of the attitude of the orbital space-based platform, 2) design and construction on the body of the space-based platform of surfaces which are asymmetric with respect to reflection, and 3) the control of the orientation of small movable vanes or sails (that is, small vanes that do not substantially increase the area of the platform) designed and constructed to produce the desired reaction thrust. When seeking an extremely low nanogravity environment for basic gravity research, the first variant is preferred. For most operations requiring reduced gravity and for materials processing work, all three variants may be used, depending on which one (or combination) is most convenient.

Regarding the exploitation of the differences between absorption and reflection in photon momentum transfer, there are in our method two variants: 1) utilization of surfaces on the platform coated with a material to provide areas of different reflectivity coupled with contemporaneous control of platform orientation to present those surfaces to the sun which will produce the desired thrusts, and 2) utilization of small moveable panels having areas of differing reflectivity and which are mounted so that the panels may be moved to vary the degrees of absorption and reflection.

Figure 3A:
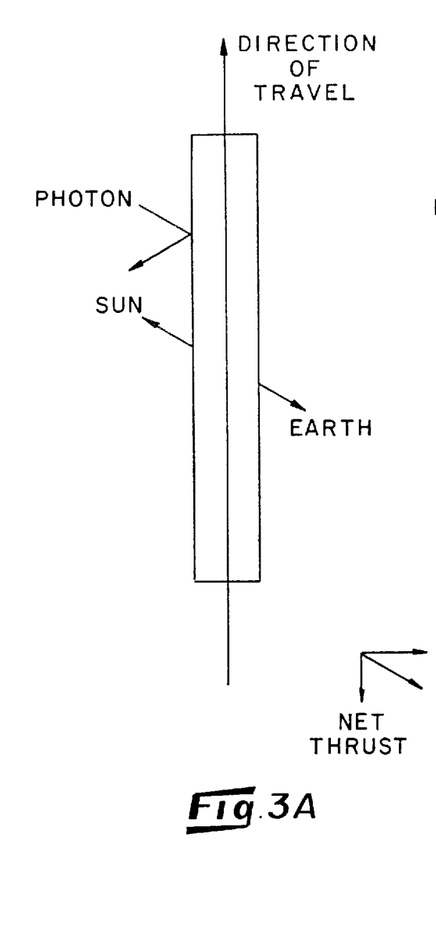
FIG. 3A shows the forces with its long axis oriented along the direction of travel.
Figure 3B:
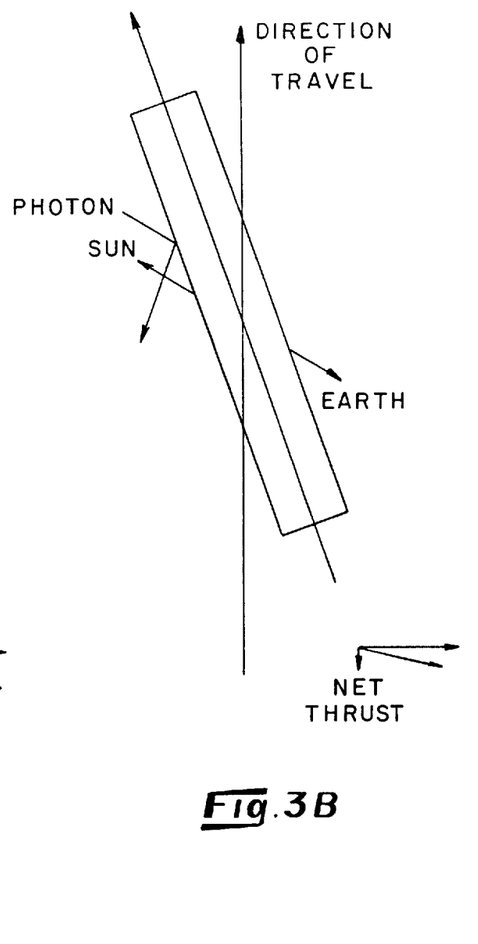
FIG. 3B shows the forces on a space platform having a pitch and/or yaw orienting with its long axis slightly inclined to the direction of travel so that the forward end of the space platform is relatively closer to the sun.

Regarding the control of the angle of photon reflection to produce a desired asymmetry, one general embodiment is the control of the attitude of the orbital space-based platform. The active elements are simply the exterior walls of the platform. A more particular embodiment is the maintenance of a small yaw and/or pitch, as shown in FIG. 3B, to produce a slight net rearward direction of the reflected photons and thus the impartation of a net momentum giving a net forward thrust component to the platform. This would gradually add to the orbital mechanical energy and angular momentum of the platform, which would counteract the effects of atmospheric drag.

Figure 3C:
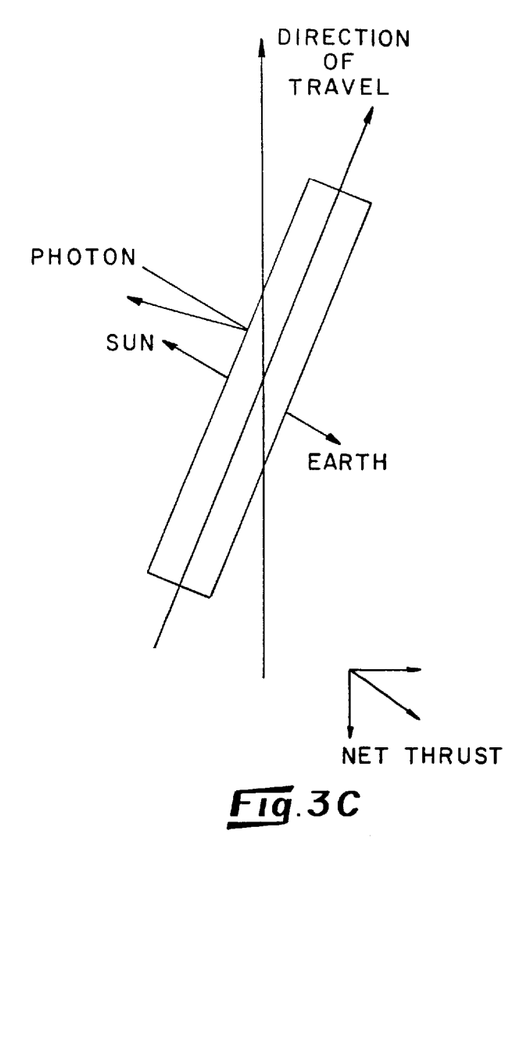
FIG. 3C shows the forces on a space platform with the forward end of the space platform relatively farther from the sun.

Reversal of the direction of the yaw and/or pitch, as shown in FIG. 3C, would decrease the orbital mechanical energy and angular momentum and the period (desirable if platform synchrony with other platforms is required). This particular embodiment is effective for platforms which are three-axis stabilized and have surfaces so configured that the result of a small yaw is in fact to produce the net thrust in the along-track direction (i.e., the yaw/pitch-induced net thrust due to reflection off the side walls must be larger than the net thrust due to reflection off the end walls). A physical embodiment would be a platform having either a large aspect ratio (e.g., a long cylinder) or convex end-caps or both. Thrust can be generated by orienting the long axis of the platform nearly along its velocity vector in order to minimize drag and then introducing a slight yaw to generate the desired thrust. A further condition is that the angle between the earth-sun line and the platform velocity vector should be appreciable (i.e., the platform is unable to tack directly into the solar radiation). This condition is met continuously if the earth-sun line is roughly perpendicular to the orbital plane. However, if the earth-sun line is close to the orbital plane, this condition is met when the platform is in the portion of its orbit that is either toward the sun or away from the sun.

Another general embodiment of the control of reflection of the photons to produce a desired asymmetry is the design and construction of surfaces on the platform's body which are asymmetric with respect to reflection so as to impart a preferential direction to the reflected photons and resulting transfer of momentum. Two specific embodiments involve: 1) cutting asymmetric screw threads, or 2) mounting solar cell panels in overlapping arrays (i.e., like weather boarding), angled so as to produce thrust in the forward direction when the platform has a given attitude. (These embodiments are not preferred for basic gravity research because symmetry is spoiled.)

When the platform is oriented so that the asymmetry in the screw threads becomes a forward-backward asymmetry with respect to the platform's velocity, the direction of reflected photons tends to have a forward-backward asymmetry. The actual asymmetry and the resulting thrust will also depend on the yaw and/or pitch of the platform. This method is convenient if an approximately constant full-orbit averaged thrust is needed and the amount can be estimated prior to launch. The angle of the screw threads and their reflectivity may be pre-set to produce the required amount of thrust, and fine tuning may be accomplished in orbit by introduction of a small yaw and/or pitch to either increase or decrease the amount of momentum imparted. The platform must be stabilized on three-axes and must have a suitable geometry (i.e., either a long aspect ratio or conical end caps). The orientation of the orbit and the velocity of the platform with respect to the earth-sun line, as noted above, apply here as well.

A further embodiment of the production of a desired asymmetry involves the use of small moveable vanes or "sails" and the control of their orientation to produce the desired impartation of momentum. In the context of our invention, "small" moveable vanes or "sails" refers to the relationship between the area(s) of the vane(s) or sail(s) and the total area of the orbital platform. The total area available for photon momentum transfer is the exterior of the platform and the area(s) of the vane(s) or sail(s). In the present invention, the addition of the surface area of the vane(s) or sail(s) does not appreciably increase the amount of area available for capturing photon momentum. Rather, the addition of the surface area of the vane(s) or sail(s) is useful in channeling the photon momentum transfer in such a manner as to produce a non-zero vector component in the desired direction. A particular embodiment would utilize solar panels or any small moveable surfaces. Three axis stabilization is required.

Regarding the exploitation of the difference between the absorption and reflection in photon momentum transfer, a general embodiment is where the orientation of the platform is controlled in order to keep certain coated surfaces of the platform angled toward the sunlight so that the desired amount of photon momentum is captured. A particular embodiment involves painting one side of the platform.

The orbital mechanical energy and angular momentum of the platform may be gradually increased by spinning the platform so that it rotates some odd number of turns per orbit with the spin phased and oriented to assure that the shinier side spends more time toward the sun when the platform is receding from the sun than when approaching it. Only attitude control of the platform is required here.

Another general embodiment involves the use of small moveable panels with areas of differing reflectivity, mounted so as to enable the total absorption (and or the amount and direction of reflection) to be varied by small movements of the panels. A particular embodiment is an array of "venetian blind" type strips painted dark on one side and bright on the other, the surface area of a particular type being variable across a wide range to create a variable amount of absorption. Another particular embodiment would be one or more partially occluded disks which are split into zones of absorption and reflection; the dark zones are exposed while the platform is heading toward the sun, and the light zones are exposed while the platform is heading away from the sun.

The orbital parameters of the orbital space-based platform influences whether the choice is made to control reflection direction (production of a desired asymmetry) or to exploit the difference between absorption and reflection. If the earth-sun line is roughly perpendicular to the orbital plane, tacking (the production of desired asymmetry) is likely to be more effective. If the earth-sun line is close to the orbital plane, either tacking or exploitation of the absorption/reflection difference will be effective.

Irrespective of the particular embodiment, when the intent is to increase the orbital mechanical energy and angular momentum of the platform by use of photon momentum transfer, the thrust must be in the forward direction. If an embodiment utilizes the production of a desired asymmetry, the average along-track component of the thrust must be in the forward direction. If the particular embodiment involves exploitation of the difference between absorption and reflection, the surface area of the platform which is oriented toward the sun must be more highly reflective when the platform is moving away from the sun than when it is moving toward the sun. One embodiment (tacking) can be used exclusively if a sun-synchronous orbit is used.

EXAMPLE I

Figure 4:
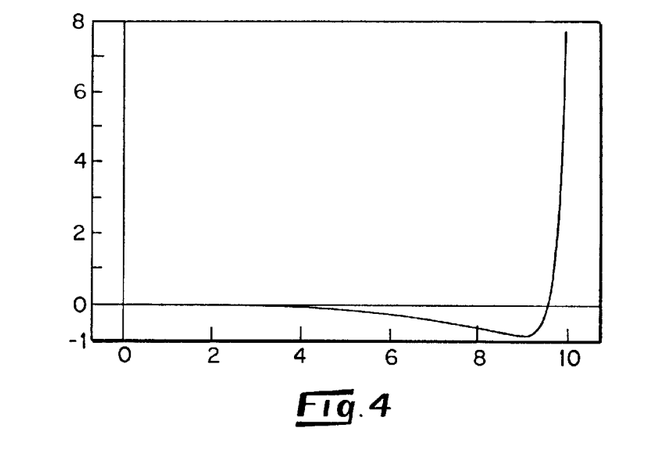
FIG. 4 shows the residual gravitational field on axis calculated for a cylinder without means of compensation (end rings or variable thickness walls) and a length of 20 meters, a radius of 0.4 meters, walls with a constant thickness and density, and end caps with a mass fixed at 0.02 times the mass of the cylinder walls.

The root mean square (RMS) of the residual gravitational field was calculated for a cylinder with a length of 20 meters, a radius of 0.4 meters, walls with a constant thickness and density and end caps with a mass fixed at 0.02 times the mass of the cylinder walls. The results are shown in FIG. 4. At the center of the long axis of the cylinder the gravitational field was zero. The gravitation field decreased to about −1 ("−1" in relation to a reference force is defined as "the force due to the uniform cylinder if concentrated as a point mass and placed at a distance of separation equal to half the length of the cylinder") (toward the direction of the center of the cylinder) about one meter from the end cap and then rapidly increased in the positive direction (toward the direction of the end cap) as the distance to the end cap decreased to zero. Thus, there was a relatively small area of the cylinder which had a suitable sub-microgravity environment.

EXAMPLE II

The root mean square (RMS) of the residual gravitational field was calculated as in EXAMPLE I for a cylinder with two and three end rings and a length of 20 meters, walls with a constant thickness and density and end caps with a mass fixed at 0.02 times the mass of the cylinder walls, using program OPT2, appendix A and OPT3, appendix B. The RMS residual field was minimized by varying the mass and radii of the end rings. The results are shown in Table I and FIGS. 5 and 6. The resulting residual fields are represented as a fraction of the gravitational mass determined in EXAMPLE I.

TABLE I

|  | Two Rings | Three Rings |
| --- | --- | --- |
| RMS Field | 0.000811 | 0.000018 |
| Radius of Ring 1[a] | 1.36608 | 7.13038 |
| Mass of Ring 1[b] | 0.10417 | 0.26575 |
| Radius of Ring 2[a] | 5.03291 | 2.96274 |
| Mass of Ring 2[b] | 0.25984 | 0.12059 |
| Radius of Ring 3[a] | — | 1.06341 |
| Mass of Ring 3[b] | — | 0.06728 |

[a]In meters.
[b]Cylinder walls have a mass of 1.00000.

Figure 5:
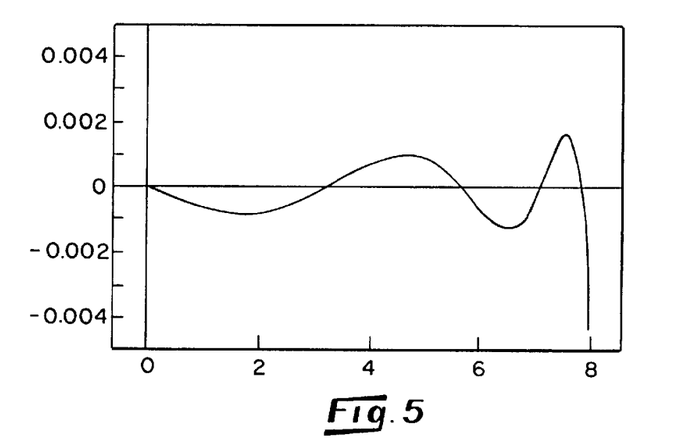
FIG. 5 shows the residual gravitational field of a cylinder on axis with two end rings and a length of 20 meters, a radius of 0.4 meters, walls with a constant thickness and density and end caps with a mass fixed at 0.02 times the mass of the cylinder walls out to about 8 meters from the center of the long axis.
Figure 6:
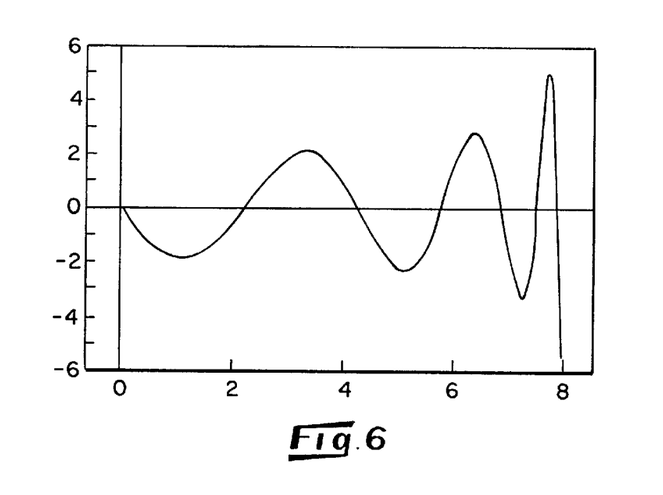
FIG. 6 shows the residual gravitational field of a cylinder with three end rings and a length of 20 meters, a radius of 0.4 meters, walls with a constant thickness and density and end caps with a mass fixed at 0.02 times the mass of the cylinder walls out to about 8 meters from the center of the long axis.

FIG. 5 shows the residual gravitational field of the cylinder with two end rings out to about 8 meters from the center of the long axis. There was a volume extending 16 meters within the cylinder with an environment suitable for sub-gravity work. FIG. 6 shows the residual gravitational field of the cylinder with three end rings out to about 8 meters from the center of the long axis. The field generated by three end rings was almost two orders of magnitude smaller then the field generated with two end rings. Again, there was a volume extending 16 meters within the cylinder with an environment suitable for sub-microgravity work.

EXAMPLE III

The RMS of the residual gravitational field was calculated as in EXAMPLE I for a cylinder with two end rings and a length of 20 meters, a radius of 0.4 meters, walls with a constant thickness and density, and end caps with varying masses, using program OPT2, appendix A. The results are shown in Table II.

TABLE II

| Cap Mass[a] | RMS Field | Radius 1[b] | Mass 1[a] | Radius 2[b] | Mass 2[a] |
|---|---|---|---|---|---|
| 0.00 | 0.001046 | 1.12317 | 0.11542 | 4.83824 | 0.26045 |
| 0.01 | 0.00095 | 1.22648 | 0.10885 | 4.91382 | 0.26018 |
| 0.02 | 0.000811 | 1.36605 | 0.10417 | 5.0328 | 0.25983 |
| 0.03 | 0.00594 | 1.56646 | 0.10335 | 5.24514 | 0.2596 |
| 0.04 | 0.00024 | 1.87759 | 0.11178 | 5.71488 | 0.26177 |
| 0.05 | 0.000688 | 2.38995 | 0.14529 | 7.33969 | 0.31069 |
| 0.06 | 0.001982 | 2.9114 | 0.24916 | 14.1791 | 3.77269 |

[a]Cylinder walls have a mass of 1.00000.
[b]In meters.

The RMS field reached a minimum for an end cap mass of about 0.04 times the mass of the cylinder walls. The field increased sharply for larger values of cap mass. Moreover, increasing the cap mass much beyond 0.04 times the mass of the cylinder walls resulted in unmanageably large ring parameters in proportion to the rest of the satellite.

EXAMPLE IV

The RMS of the residual gravitational field was calculated as in EXAMPLE I for a cylinder with two end rings and a length of 20 meters, walls with a constant thickness and density, end caps with masses of 0.02 times the mass of the cylinder wall and a varying radius, using program OPT2, appendix A. The results are shown in Table III.

TABLE III

| Radius[a] | RMS Field | Radius 1[a] | Mass 1[b] | Radius 2[a] | Mass 2[b] |
|---|---|---|---|---|---|
| 0.4 | 0.000811 | 1.36605 | 0.10417 | 5.0328 | 0.25983 |
| 0.6 | 0.000779 | 1.40772 | 0.10465 | 5.06202 | 0.26031 |
| 0.8 | 0.000745 | 1.45893 | 0.10503 | 5.09614 | 0.26097 |
| 1.0 | 0.000712 | 1.5168 | 0.1051 | 5.12999 | 0.26182 |
| 1.2 | 0.000686 | 1.57668 | 0.10462 | 5.15894 | 0.26291 |
| 1.5 | 0.000662 | 1.66267 | 0.10251 | 5.1866 | 0.2651 |

[a]In meters.
[b]Cylinder walls have a mass of 1.00000.

Increasing the radius of the cylinder a significant amount (by nearly a factor of four) did not appreciably change the parameters of the rings in order to maintain optimum residual field.

EXAMPLE V

The root mean square (RMS) of the residual gravitational field was calculated as in EXAMPLE I for a cylinder with a length of 20 meters, a radius of 0.4 meters, and walls with a constant thickness and density, using program OPCONT, appendix C. The residual field was minimized by varying the mass distribution of the end caps. The distribution of the mass in the end caps was approximated by a power series of even powers of z (the axial distance from the center of the cylinder) and $\rho$ (the radial distance from the center of the end caps). Odd coefficients of the Taylor series vanish by symmetry. The results are shown in Table IV for j and k which are the maximum powers of z and $\rho$. The resulting residual fields are represented as a fraction of the gravitational mass determined in EXAMPLE I.

TABLE IV

| | | j = 4 | j = 8 | j = 12 | j = 16 |
|---|---|---|---|---|---|
| k = 0 | Mass | 0.03057 | 0.02471 | 0.02294 | 0.02348 |
| | RMS | 0.12986 | 0.02371 | 0.00970 | 0.00920 |
| k = 2 | Mass | — | 0.02663 | 0.01941 | 0.01609 |
| | RMS | — | 0.02246 | 0.00545 | 0.00124 |
| k = 4 | Mass | — | — | — | 0.01894 |
| | RMS | — | — | — | 0.00090 |

As can be seen, those systems wherein the mass of the end caps is distributed in a manner such that the mass is concentrated toward the edges of the end caps in a sharply rising gradient (that is, higher values of k and j) produce smaller residual gravitational fields. The appropriate distribution of mass in the end caps can produce results similar to those seen when using external rings.

Although this specification discloses particular embodiments of the invention, these examples merely describe illustrations of the invention. Those skilled in the art may suggest numerous rearrangements, modifications and substitutions of parts of the invention without departing from the spirit of the invention. In particular, the space platforms may be prepared from a variety of materials. Also, the various techniques disclosed and claimed herein may be combined in a variety of ways to accomplish the objectives of the present invention.

The appended claims set forth various novel and useful features of the invention.

What is claimed is:

1. A method for altering nonabruptly the orbital mechanical energy and angular momentum of an orbital space-based platform having a large aspect ratio, the method comprising controlling the attitude of the space-based platform thereby transferring the momentum from solar photons asymmetrically to a surface area of the orbital space-based platform so as to produce a reaction thrust having a non-zero component in a direction suitable for variably altering or substantially stabilizing the orbital mechanical energy and angular momentum of the platform in the substantial absence of solar sails.

2. The method of claim 1 further comprising controlling the angle of reflection of solar photons reflecting off the exterior of the orbital space-based platform at a desired angle of reflection.

3. The method of claim 2 wherein controlling the angle of reflection of solar photons includes controlling the yaw or pitch of the space-based platform.

4. The method of claim 3 wherein the space-based platform is substantially a cylinder.

5. The method of claim 3 wherein the space-based platform has at least one convex end cap.

6. The method of claim 2 wherein the step of controlling the angle of reflection further comprises orienting the long axis of the platform substantially along the velocity vector of the platform and then introducing a yaw or pitch in the direction of the sun.

* * * * *